United States Patent
Tark et al.

(10) Patent No.: US 12,396,291 B2
(45) Date of Patent: Aug. 19, 2025

(54) METHOD FOR MANUFACTURING POROUS POLYSILOXANE FILM, POROUS POLYSILOXANE FILM MANUFACTURED THEREBY, AND SOLAR CELL MODULE COMPRISING SAME

(71) Applicants: POSCO, Pohang-si (KR); RESEARCH INSTITUTE OF INDUSTRIAL SCIENCE & TECHNOLOGY, Pohang-Si (KR)

(72) Inventors: Sung-Ju Tark, Pohang-Si (KR); Im-Soo Mok, Gumi-si (KR); Ji-Sang Park, Seoul (KR); Kun-Hoon Baek, Seoul (KR); A-Rong Kim, Pohang-si (KR)

(73) Assignee: POSCO CO., LTD, Pohang-si (KR)

( * ) Notice: Subject to any disclaimer, the term of this patent is extended or adjusted under 35 U.S.C. 154(b) by 708 days.

(21) Appl. No.: 17/312,652

(22) PCT Filed: Aug. 2, 2019

(86) PCT No.: PCT/KR2019/009647
§ 371 (c)(1),
(2) Date: Jun. 10, 2021

(87) PCT Pub. No.: WO2020/122348
PCT Pub. Date: Jun. 18, 2020

(65) Prior Publication Data
US 2022/0052211 A1    Feb. 17, 2022

(30) Foreign Application Priority Data
Dec. 11, 2018   (KR) .................. 10-2018-0159017

(51) Int. Cl.
*H10F 77/30*    (2025.01)
*B29C 44/56*    (2006.01)
(Continued)

(52) U.S. Cl.
CPC ....... *H10F 77/315* (2025.01); *B29C 44/5609* (2013.01); *C08G 77/06* (2013.01);
(Continued)

(58) Field of Classification Search
CPC ... H01L 31/048; H01L 31/0488; H10F 71/00; H10F 77/315
See application file for complete search history.

(56) References Cited

U.S. PATENT DOCUMENTS 6,852,920 B2    2/2005  Sager et al.
2005/0166958 A1  8/2005  Park et al.
(Continued)

FOREIGN PATENT DOCUMENTS

CN    101548391 A    9/2009
CN    105778145 A    7/2016
(Continued)

OTHER PUBLICATIONS

English translation of Ito et al., JP2011-032314 A.*
(Continued)

*Primary Examiner* — Tamir Ayad
(74) *Attorney, Agent, or Firm* — Morgan Lewis & Bockius LLP (57) ABSTRACT

The purpose of the present invention is to provide a method for manufacturing a solar cell module, comprising the steps of: placing a mixture solution comprising a polysiloxane and a curing agent in a humidified condition and sealing same; forming a polysiloxane film by curing the mixture solution; and manufacturing a porous polysiloxane film by evaporating water drops formed on the surface of the polysiloxane film. By applying the porous polysiloxane film manufactured by the present invention to a solar cell module, weight reduction and efficiency improvement effects of the solar cell module can be obtained.

5 Claims, 7 Drawing Sheets

(51) Int. Cl.
  *C08G 77/06* (2006.01)
  *C08J 5/18* (2006.01)
  *C08J 9/28* (2006.01)
  *H10F 71/00* (2025.01)
  *B29K 83/00* (2006.01)
  *B29K 105/04* (2006.01)
  *B29L 31/34* (2006.01)
  *H02S 20/26* (2014.01)

(52) U.S. Cl.
  CPC .  *C08J 5/18* (2013.01); *C08J 9/28* (2013.01); *H10F 71/00* (2025.01); *B29K 2083/00* (2013.01); *B29K 2105/04* (2013.01); *B29L 2031/34* (2013.01); *C08J 2201/0504* (2013.01); *C08J 2383/04* (2013.01); *H02S 20/26* (2014.12)

(56) References Cited

U.S. PATENT DOCUMENTS

| | | |
|---|---|---|
| 2005/0166959 A1 | 8/2005 | Lee et al. |
| 2006/0174934 A1 | 8/2006 | Sager et al. |
| 2008/0115829 A1 | 5/2008 | Lee et al. |
| 2008/0276983 A1 | 11/2008 | Drake et al. |
| 2009/0126791 A1* | 5/2009 | Lu .................. H01L 31/048 136/258 |
| 2010/0037948 A1 | 2/2010 | Dwang et al. |
| 2011/0024935 A1 | 2/2011 | Ito et al. |
| 2011/0174377 A1 | 7/2011 | Lee et al. |
| 2013/0340829 A1 | 12/2013 | Hatakeyama |
| 2014/0099537 A1 | 4/2014 | Kato et al. |
| 2015/0171249 A1* | 6/2015 | Howell ............. B32B 17/10018 136/259 |
| 2015/0287860 A1 | 10/2015 | Tsukada et al. |
| 2016/0032074 A1 | 2/2016 | Aizenberg et al. |
| 2016/0340551 A1* | 11/2016 | Lin .................... G02B 1/111 |
| 2021/0036172 A1 | 2/2021 | Tark et al. |

FOREIGN PATENT DOCUMENTS

| | | |
|---|---|---|
| EP | 2597148 A1 | 5/2013 |
| JP | 2006-316220 A | 11/2006 |
| JP | 2011-032314 A | 2/2011 |
| KR | 10-2005-0078856 A | 8/2005 |
| KR | 10-2005-0078857 A | 8/2005 |
| KR | 10-2008-0045025 A | 5/2008 |
| KR | 10-2009-0034830 A | 4/2009 |
| KR | 10-2010-0088310 A | 8/2010 |
| KR | 10-2011-0085317 A | 7/2011 |
| KR | 101048059 B1 | 7/2011 |
| KR | 10-1127182 B1 | 3/2012 |
| KR | 10-2012-0052049 A | 5/2012 |
| KR | 10-2013-0037895 A | 4/2013 |
| KR | 10-2013-0043395 A | 4/2013 |
| KR | 10-2014-0038943 A | 3/2014 |
| KR | 10-2014-0071954 A | 6/2014 |
| KR | 10-2015-0116414 A | 10/2015 |
| KR | 101603163 B1 | 3/2016 |
| KR | 101700379 B1 | 1/2017 |
| KR | 101917533 B1 | 11/2018 |
| KR | 101982589 B1 | 5/2019 |
| KR | 10-2020-0036528 A | 4/2020 |
| KR | 10-2020-0050540 A | 5/2020 |
| KR | 10-2020-0064842 A | 6/2020 |
| WO | 2009/007786 A2 | 1/2009 |
| WO | 2019/132307 A1 | 7/2019 |

OTHER PUBLICATIONS

International Search Report dated Nov. 19, 2019 issued in International Patent Application No. PCT/ KR2015/009647 (with English translation).
Chinese Office Action dated Aug. 3, 2022 issued in Chinese Patent Application No. 201980081958.9 (with English translation).
Extended European Search Report dated Jan. 4, 2022 issued in European Patent Application No. 19896400.9.
P. Escale, et al., "Recent advances in honeycomb-structured porous ploymer films prepared via breath figures," European Polymer Journal, vol. 48, No. 6, Mar. 1, 2012, pp. 1001-1025.

* cited by examiner

METHOD FOR MANUFACTURING POROUS POLYSILOXANE FILM, POROUS POLYSILOXANE FILM MANUFACTURED THEREBY, AND SOLAR CELL MODULE COMPRISING SAME

CROSS-REFERENCE OF RELATED APPLICATIONS

This application is the U.S. National Phase under 35 U.S.C. § 371 of International Patent Application No. PCT/KR2019/009647, filed on Aug. 2, 2019, which in turn claims the benefit of Korean Application No. 10-2018-0159017, filed on Dec. 11, 2018, the entire disclosures of which applications are incorporated by reference herein.

TECHNICAL FIELD

The present disclosure relates to a method for manufacturing a porous polysiloxane film, a porous polysiloxane film manufactured thereby, and a solar cell module comprising the same.

BACKGROUND ART

In general, in a solar cell module, a transparent protective glass and a protective film may be used to protect the solar cell module from various external factors. Based on 250 W, a weight of a conventional solar cell module sold on the market reaches about 18 kg on average, and application thereof, such as being attached to a building or being integrated with a building may be restricted due to a load. The transparent protective glass may occupy about 60% of the weight of the conventional solar cell module, and should be improved in order to reduce the weight of the module.

Meanwhile, silicon solar cells used in solar cell modules may be opaque and monochromatic, and it may be difficult to expect an aesthetic effect of a building therefrom. To improve this, a method of attaching a colored PVB film to a protective glass or introducing a colored film or a color modulation layer below an EVA film has been developed.

Meanwhile, in order to prevent reflection of sunlight to improve efficiency of the module, and to prevent light from being reflected to an observer, a method of coating an antireflection film on a protective glass or texturing a surface of a solar cell has been developed.

PRIOR TECHNICAL LITERATURE

Patent Literature

Korean Patent Registration No. 10-1700379
Korean Patent Registration No. 10-1048059
Korea Patent Publication No. 10-2013-0037895
Korean Patent Registration No. 10-1127182
Korean Patent Registration No. 10-1603163

DISCLOSURE

Technical Problem

An aspect of the present disclosure is to introduce a porous polysiloxane film capable of replacing a protective glass, a protective film, and an antireflection film used in a solar cell module to reduce a weight of the solar cell module, and to control reflectance to improve efficiency of the solar cell module. In addition, colors may be introduced into the solar cell module to improve aesthetics.

Technical Solution

According to an aspect of the present disclosure, a method for manufacturing a porous polysiloxane film includes disposing and sealing a mixed solution including polysiloxane and a curing agent in a humidified environment; curing the mixed solution to form a polysiloxane film; and evaporating water droplets formed on a surface of the polysiloxane film.

According to an aspect of the present disclosure, a porous polysiloxane film having $3.5 \times 10^6$ to $1.0 \times 10^7$ pores per unit area ($cm^2$) in a surface portion, and an average particle diameter of the pores is 10 to 15 μm is provided.

According to an aspect of the present disclosure, a solar cell module includes a rear protective layer; a secondary encapsulant; a solar cell; and the above porous polysiloxane film.

According to an aspect of the present disclosure, a method for manufacturing a solar cell module includes disposing and sealing a mixed solution including polysiloxane and a curing agent in a humidified environment; curing the mixed solution to form a polysiloxane film; evaporating water droplets formed on a surface of the polysiloxane film to prepare a porous polysiloxane film; and stacking the porous polysiloxane film on a solar cell.

Advantageous Effects

According to an aspect of the present disclosure, a solar cell module may be applied to various fields by introducing a porous polysiloxane film having excellent mechanical properties and light transmittance and having a low weight to the solar cell module, to reduce a weight of the solar cell module.

In addition, according to an aspect of the present disclosure, a solar cell module having a color without a separate color film or color modulation layer may be implemented, and manufacturing costs may be reduced by simplifying a method for manufacturing the solar cell module.

BEST MODE FOR INVENTION

Hereinafter, preferred embodiments of the present disclosure will be described. However, embodiments of the present disclosure may be modified to have various other forms, and the scope of the present disclosure is not limited to the embodiments described below.

According to an embodiment of the present disclosure, a method for manufacturing a porous polysiloxane film, including disposing and sealing a mixed solution including polysiloxane and a curing agent in a humidified environment; curing the mixed solution to form a polysiloxane film; and evaporating water droplets formed on a surface of the polysiloxane film may be provided.

In the present disclosure, the mixed solution may be a mixture of the polysiloxane and the curing agent in a weight ratio of 1:1 to 1:2. When a mixing ratio of the polysiloxane and the curing agent is outside of the above range, curing of the polysiloxane may not be completed or it may be difficult to form pores. In the present disclosure, types of the polysiloxane and types of the curing agent are not limited, and known ones may be selected and used. Preferably, a curing agent containing polydimethylsiloxane and silica may be mixed in a weight ratio of 1:1.

In preparing the mixed solution, a dye for imparting color to the mixed solution of the polysiloxane and the curing agent may be added. A water-soluble dye, an oil-soluble dye, an organic pigment, or the like may be used as the dye, but the present disclosure is not limited thereto, and preferably, the oil-soluble dye may be used.

The dye may contain 15 to 200 nL for 1 g of polysiloxane, and may exhibit optimal color development while maintaining efficiency of the solar cell within the above range. When an amount of the dye is excessively included, conversion efficiency of the solar cell may be lowered. Therefore, an addition amount of the dye should be appropriately adjusted.

The mixed solution, with or without addition of the dye, may be applied into a mold or a container in a humidified environment. In the present disclosure, the humidified environment refers to disposing a mold, a container, or the like into which the mixed solution is applied, in a container containing distilled water or in an environment with high humidity. The humidified environment may be completed, and may be sealed such that water vapor cannot escape.

Figure 1:
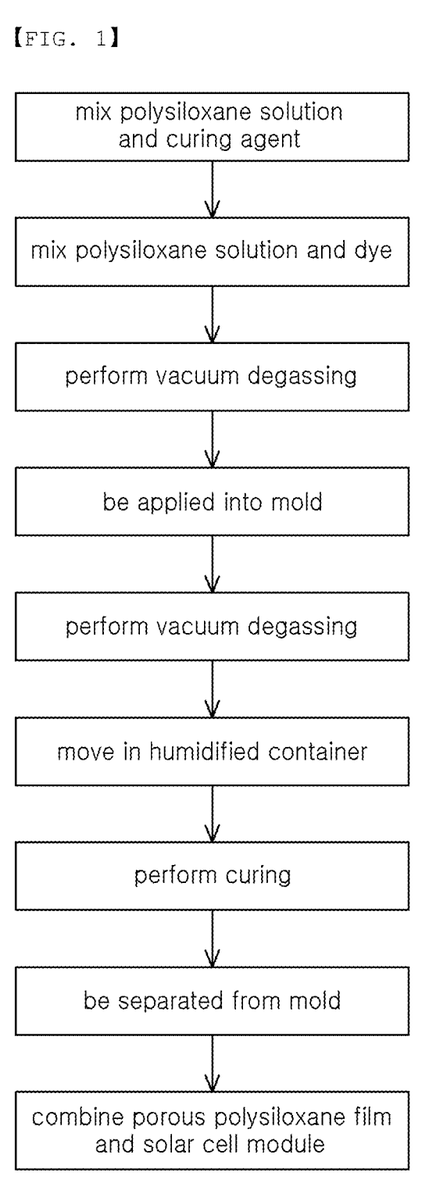
FIG. 1 is a schematic diagram illustrating a manufacturing process of a solar cell module to which a porous polysiloxane film of the present disclosure is applied.
Figure 2:
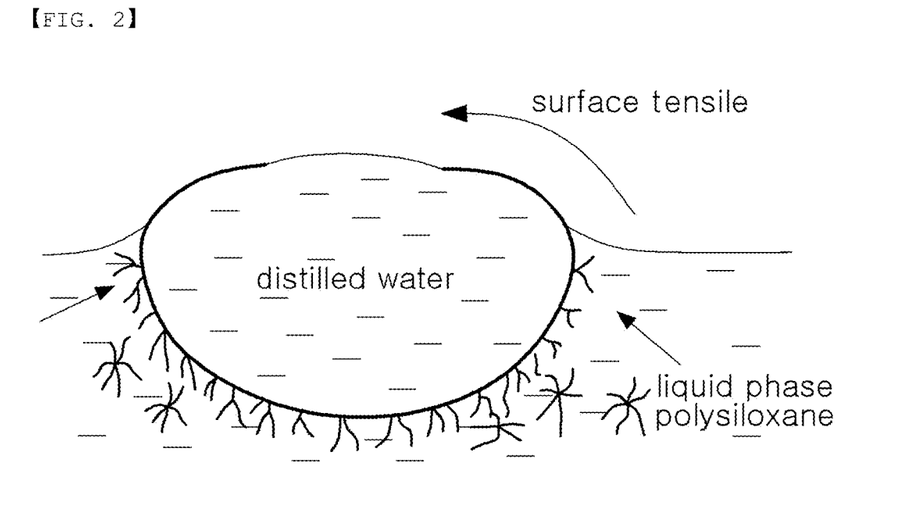
FIG. 2 is a schematic diagram illustrating a process in which pores is formed on a surface of liquid phase polysiloxane.
Figure 3:
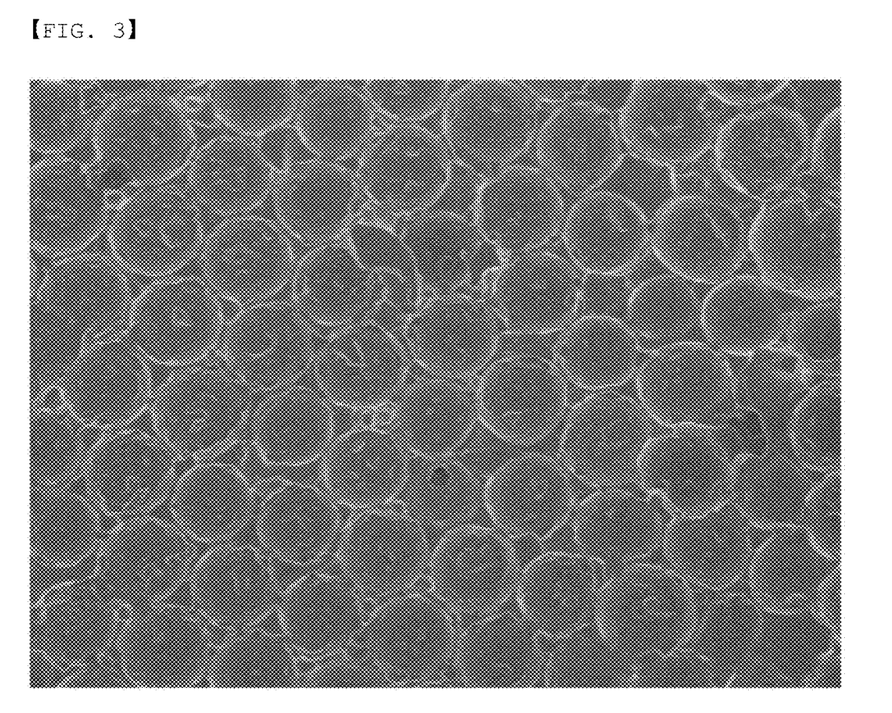
FIG. 3 is an SEM image of a porous polysiloxane film of the present disclosure.

In the curing the prepared mixed solution by applying heat in the humidified environment, an internal space of the sealed container becomes saturated with the water vapor due to evaporation of the distilled water. Referring to FIG. 2, a portion of the water vapor may be condensed to form water droplets on a surface of liquid phase polysiloxane, which is in a liquid phase. When the polysiloxane is cured in this state, the water droplets may remain on a surface of the polysiloxane film, and then, when the water droplets is evaporated, a porous polysiloxane film may be prepared, as shown in FIG. 3.

A curing temperature of the mixed solution may be 40 to 70° C., and a curing time may be 2 to 4.5 hours, but are not limited thereto, and may be freely adjusted according to types of the polysiloxane and types of the curing agent, used therein, and the humidified environment.

In addition, in the present disclosure, a vacuum pump may be used to perform degassing before and/or after being applied into the mold or the container, in order to remove air bubbles present in the mixed solution.

According to another embodiment of the present disclosure, a porous polysiloxane film manufactured by the method for manufacturing the porous polysiloxane film described above may be provided. The porous polysiloxane film may be particularly applied to a solar cell module, and may be replaced with an antireflection film, a protective film, and a protective glass in a conventional solar cell module.

Figure 4:
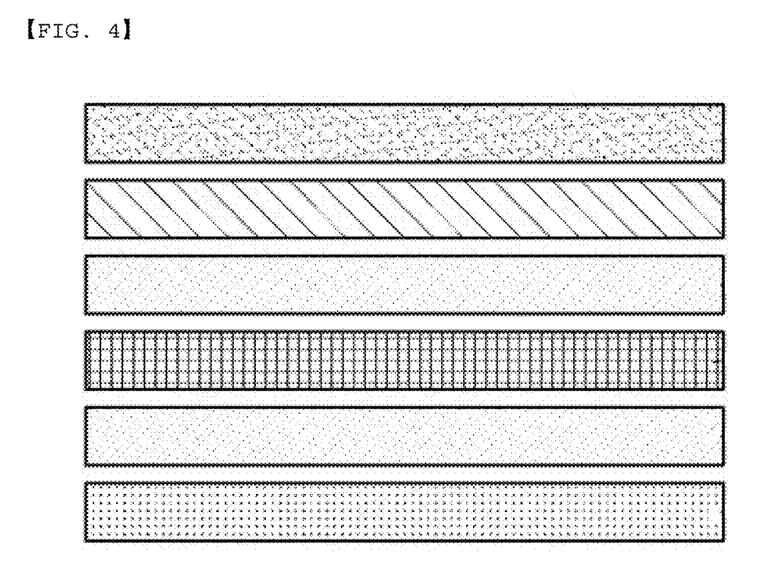
FIG. 4 is a schematic diagram illustrating a conventional photovoltaic module.

The solar cell module may be a device that generates electric energy by absorbing light energy. The conventional solar cell module may have a structure in which a protective film, a solar cell, a protective film, a protective glass, and an antireflection film are sequentially stacked on a rear protective layer (See FIG. 4). Light reaching the solar cell may be scattered, or may be transmitted through the solar cell. In order to increase an amount of electric energy generated by the solar cell, an amount of absorbing light should increase.

When light reflection generated on a surface of the solar cell is reduced, a short circuit current density ($J_{sc}$) of the solar cell may be improved, and efficiency of the solar cell module may be improved. To this end, conventionally, a surface of a solar cell may be textured using a chemical or the like, or an antireflection film may be introduced on the solar cell.

Figure 5:
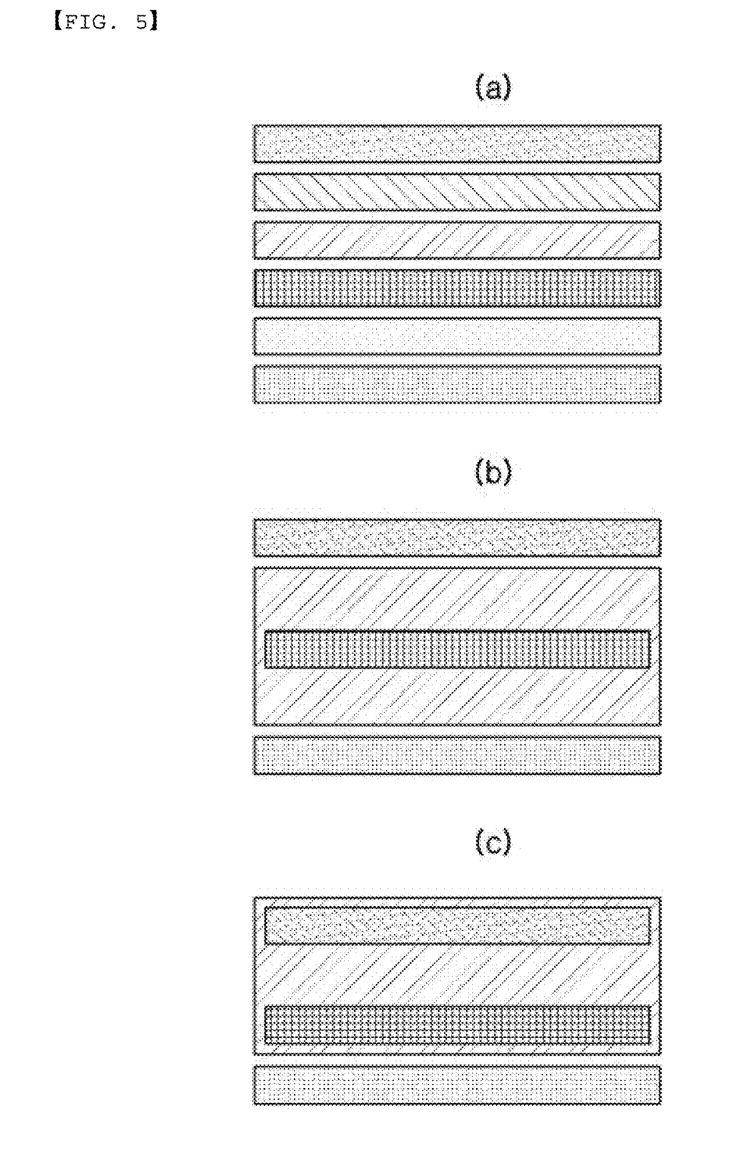
FIG. 5 is a schematic diagram illustrating a solar cell module to which a conventional polysiloxane film is applied.
Figure 6:
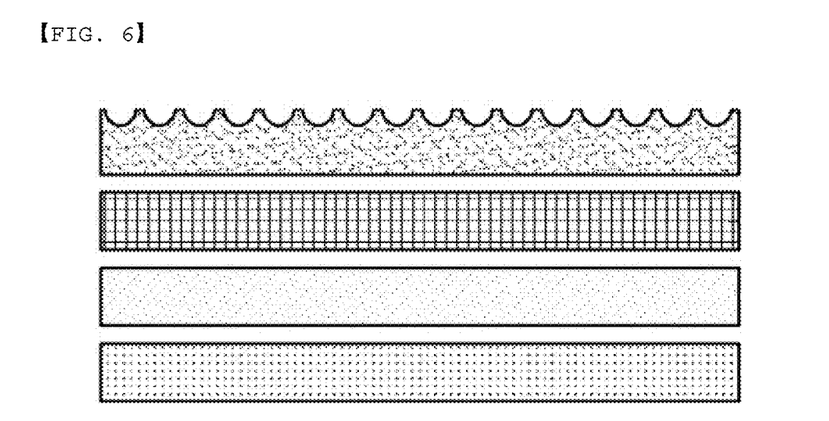
FIG. 6 is a schematic diagram illustrating a solar cell module to which a porous polysiloxane film of the present disclosure is applied.

In the solar cell module, since the protective glass may occupy about 60% of a weight of the solar cell module, there have been many efforts to replace the protective glass with a low-weight polysiloxane film. FIG. 5 shows a solar cell module to which a conventional polysiloxane film is introduced. As can be seen in FIG. 5, the purpose of manufacturing a low-weight solar cell module has been achieved by introducing a polysiloxane film into the solar cell module, but there may be a problem in the manufacturing process since the antireflection film is still included.

In a porous polysiloxane film of the present disclosure, a surface may be patterned with water droplets to form pores, and when applied to a solar cell module, reflectance may be controlled due to the pores. In a porous polysiloxane film of the present disclosure, the number of pores may be $3.5 \times 10^6$ to $1.0 \times 10^7$ pores per unit area ($cm^2$). When the number of pores is outside of the above range, a pattern may not be formed properly, such as cracking or the like on the surface of the film, and there may be a concern that reflectance and absorbance of the film increase when applied to the solar cell module.

In addition, the pores present on the surface of the porous polysiloxane film may have an average particle diameter of 10 to 15 μm. When the average particle diameter is less than 10 μm, there may be a problem of increasing reflectance and absorbance of the porous polysiloxane film. When the average particle diameter exceeds 15 μm, an effect of controlling reflectance of the pattern may decrease, which is not desirable.

As described above, a porous polysiloxane film of the present disclosure may be to replace the protective film and the protective glass of the conventional solar cell module, and may have a transmittance of about 95 to 99%, depending on a thickness of the porous polysiloxane film. The porous polysiloxane film according to the present disclosure may have superior transmittance, compared to transmittance (91%) of a conventional protective glass used in a solar cell module.

A porous polysiloxane film according to a preferred embodiment of the present disclosure may have a density of about 0.995 $g/cm^3$, and may be significantly smaller than a density of a protective glass (about 2.5 $g/cm^3$) commonly used in a solar cell module. A weight of the solar cell module may be reduced by about 60% or more.

In a solar cell module to which a porous polysiloxane film of the present disclosure is applied, a solar cell therein may be concealed by scattering of incident light, when observed from an external space. Such a characteristic may be particularly effective in improving saturation of a colored glass as well as in improving aesthetics of a building integrated photovoltaic (BIPV) module. The concealing property may be expressed as a haze value, and the haze value may be defined as a ratio of diffused light (DF) with respect to linearly transmitted light (PF), when passing through a specimen. In the present disclosure, the haze value may be within a range of 20 to 50%.

The porous polysiloxane film may be prepared from a mixed solution containing polysiloxane, a curing agent, and a dye to have a color, and the color may be adjusted according to the dye to be added. Even when the dye is included, mechanical properties of the film may not be affected, and there may be no need to separately introduce a color film or a color modulation layer, when applied to a solar cell module.

According to another embodiment of the present disclosure, a solar cell module including a porous polysiloxane film may be provided. In the solar cell module, a secondary encapsulant, a solar cell, and a porous polysiloxane film may be sequentially stacked on a rear protective layer made of glass or polymer, and the rear protective layer, the secondary encapsulant, and the solar cell may be selected from known ones, and may be used. When such a porous polysiloxane film is applied to a solar cell module, a solar cell module having improved efficiency due to a low weight and reduced reflectivity may be manufactured, and the porous polysiloxane film may be applied to fields such as an optical display, a mobile display, or the like, in addition to a solar cell module.

Mode for Invention

EXAMPLE

Hereinafter, embodiments of the present disclosure will be described in detail. The following examples are only for understanding the present disclosure, and do not limit the present disclosure.

Inventive Example 1

(1) Preparation of Porous Polydimethylsiloxane (PDMS) Film

A mixed solution was prepared by mixing 2.5 g of polydimethylsiloxane (SR-580 A, HeeSung STS), which was in a liquid phase, and 2.5 g of a curing agent (SR-580 B, HeeSung STS). The mixed solution was degassed using a vacuum pump for 1 hour, applied into a mold, and degassed again using a vacuum pump for 1 hour. The degassed mixed solution was placed in a central portion of a container containing distilled water and then leveled, the container was sealed and then placed in an electric oven, and the mixed solution was then cured at 70° C. for 4 hours. A cured porous polydimethylsiloxane film was separated from the mold.

The porous polydimethylsiloxane film was measured to have a hardness of 82 shore A, an elongation of 32%, a tensile strength of 1 MPa, and a tear strength of 1 N/mm (KS M 6518). In addition, the porous polydimethylsiloxane film appeared gray due to pores in a surface portion, when observed from an external space.

(2) Preparation of Solar Cell Module

A secondary encapsulant made of EVA, a solar cell, and a primary encapsulant made of EVA were sequentially stacked on a back sheet, and the porous polydimethylsiloxane film was stacked on the primary encapsulant to prepare a solar cell module.

Inventive Example 2

A porous polydimethylsiloxane film and a solar cell module were prepared in the same manner as in Inventive Example 1, except that 40 nL of a dye having a sky blue color (CANDLEWORKS company) was added when preparing a mixed solution.

Inventive Example 3

A porous polydimethylsiloxane film and a solar cell module were prepared in the same manner as in Inventive Example 1, except that 40 nL of a dye having a gold color (CANDLEWORKS company) was added when preparing a mixed solution.

Comparative Example 1

A mixed solution was prepared by mixing 2.5 g of polydimethylsiloxane (SR-580 A, HeeSung STS), which was in a liquid phase, and 2.5 g of a curing agent (SR-580 B, HeeSung STS). The mixed solution was degassed using a vacuum pump for 1 hour, applied into a mold, and degassed again using a vacuum pump for 1 hour. The degassed mixed solution was placed in a central portion of a container and then leveled, the container was sealed and then placed in an electric oven, and the mixed solution was then cured at 70° C. for 4 hours. A cured porous polydimethylsiloxane film was separated from the mold.

Comparative Example 2

A porous polydimethylsiloxane film and a solar cell module were prepared in the same manner as in Comparative Example 1, except that 40 nL of a dye having a sky blue color (CANDLEWORKS company) was added when preparing a mixed solution.

Comparative Example 3

A porous polydimethylsiloxane film and a solar cell module were prepared in the same manner as in Comparative Example 1, except that 40 nL of a dye having a gold color (CANDLEWORKS company) was added when preparing a mixed solution.

Experimental Example

Figure 7:
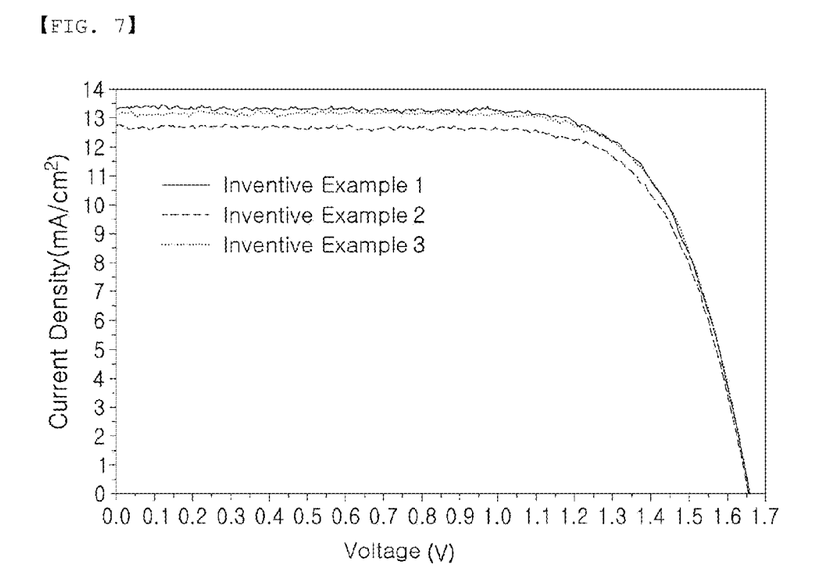
FIG. 7 is a J-V graph of a solar cell module to which a porous polysiloxane film of the present disclosure is applied.
Figure 8:
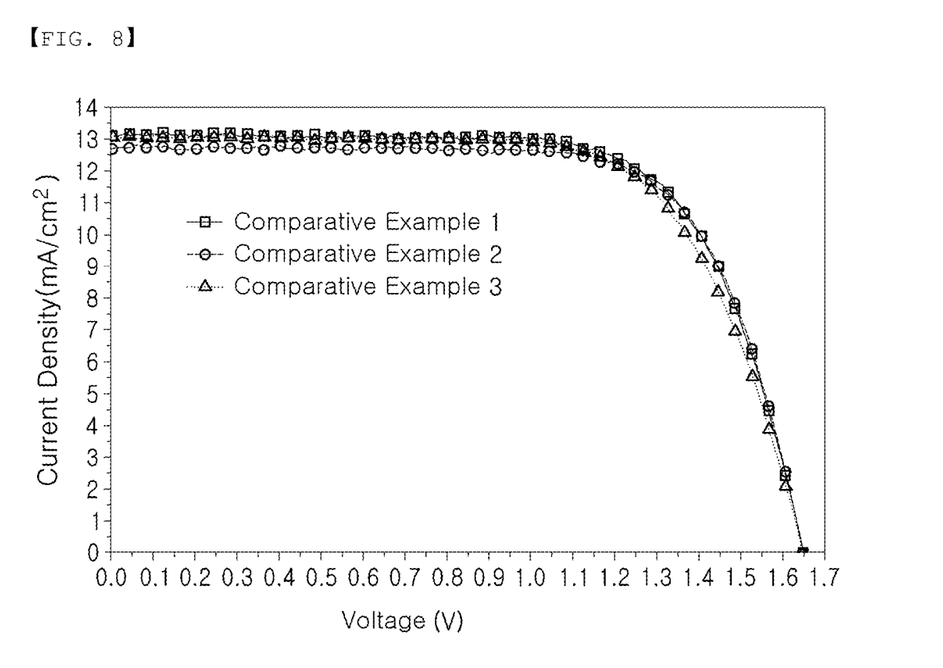
FIG. 8 is a J-V graph of a solar cell module to which a conventional polysiloxane film is applied.

The following values were measured for the porous polydimethylsiloxane film and the solar cell module, prepared in Inventive Examples and Comparative Examples, and were illustrated in Table 1 and FIGS. 7 and 8.

1. Transmittance (%)

Transmittance of the porous polydimethylsiloxane film was measured using a UV-Vis Spectrometer (S-3100, SCINCO) having a wavelength step of 1 nm and a range of 300 to 700 nm.

2. Number of Pores Per Unit Area (Pcs/Cm$^2$) and Average Particle Diameter (μm) of Pores In the SEM image of the porous polydimethylsiloxane film, the number of pores present in a certain area was measured, and an average particle diameter of the pores was calculated.

3. Current Density, Short Circuit Current Density ($J_{sc}$) (mA/Cm²), and Open Circuit Voltage ($V_{oc}$) (V)

The solar cell module was connected to an Electrochemical Station (VSP CLB-2000, Bio-Logic Science Instruments), J-V curves of the solar cell module were measured using a Solar Simulator (Sun 3000, Class AAA, ABET Technology) as a light source. A scan speed at this time was 100 mV/s, and was measured in a voltage range of $V_{oc}$ to 0 V.

4. Filling Rate (F. F.) (%)

Values for a short circuit current density ($J_{sc}$), an open circuit voltage ($V_{oc}$), a current density ($J_{max}$), and a voltage ($V_{max}$), measured in Item 3 above, were used to calculate a filling rate by Equation (1) below.

$$FF = \frac{J_{max} \times V_{max}}{J_{SC} \times V_{OC}} \qquad \text{Equation (1)}$$

Where, $J_{max}$ and $V_{max}$ represent current density and voltage values, respectively, at a point at which a power value (JV) reaches the maximum value.

5. Conversion Efficiency ($\eta$) and $\eta/\eta_0$ (%)

Values for a short circuit current density ($J_{sc}$), an open circuit voltage ($V_{oc}$), and a filling rate, measured in Items 3 and 4 above, were used to calculate conversion efficiency (PCE) by Equation (2) below.

$$PCE = J_{SC} \times V_{OC} \times FF \qquad \text{Equation (2)}$$

Where, $\eta_0$ represents conversion efficiency of the PDMS film prepared in Comparative Example 1, and relative conversion efficiency of a PDMS film, compared to the PDMS film of Comparative Example 1, was expressed as $\eta/\eta 0$.

6. Flame Retardancy Test

The porous polydimethylsiloxane film prepared in Inventive Example 1 was cut into a size of 5 cm in width, 5 cm in length, and 0.4 cm in height, to prepare a specimen, and the specimen was heated at 1000° C. for 30 seconds using an LPG gas torch.

wavelength range of about 400 to 1000 nm. When the dye having a sky blue color was added thereto, transmittance of light in the wavelength range of 600 to 750 nm was reduced, and current density was reduced.

In Inventive Example 3 to which the dye having a gold color was added, conversion efficiency thereof was similar to that of Inventive Example 1. This may be because transmittance of light in the wavelength range of 320 to 450 nm was reduced due to characteristics of the dye having a gold color, but transmittance of light in the wavelength range of about 400 to 1000 nm in which photoelectron conversion occurs was not significantly reduced. Therefore, even when the dye having a gold color was added, conversion efficiency was not affected.

When a porous PDMS film is used for a solar cell module as in the above Inventive Examples, efficiency of a solar cell may be improved, and an application range of the solar cell module may be widened due to a low weight thereof.

Figure 9:
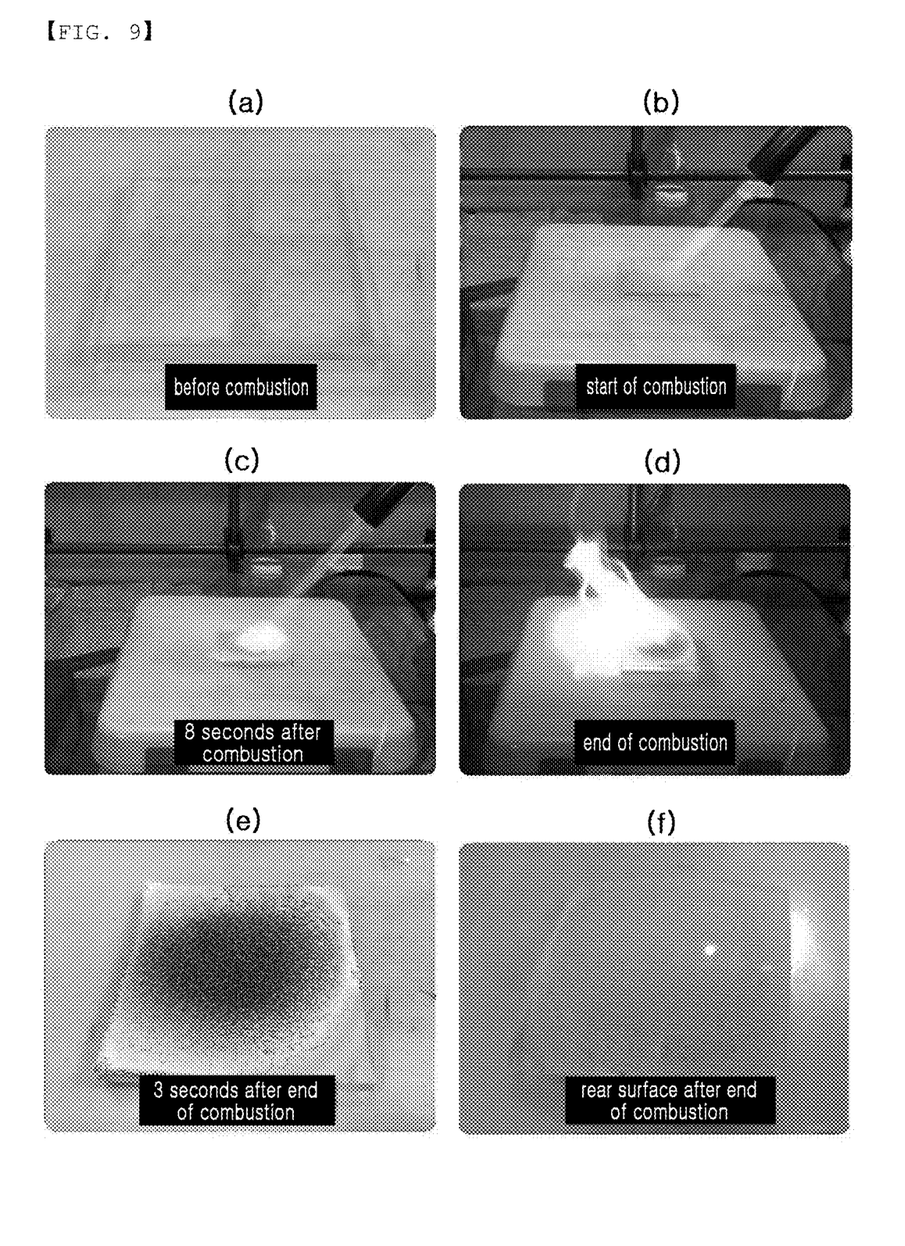
FIG. 9 illustrates an experimental procedure for evaluating flame retardancy of a porous polysiloxane film of the present disclosure.

In addition, as results of the flame retardancy test of the porous polydimethylsiloxane film, the specimen of the porous polydimethylsiloxane film of Inventive Example 1 ignited immediately before end of combustion, and was then spontaneously combusted after about 3 seconds. The combustion proceeded to about 2 mm inwardly from a surface of the specimen, and a rear surface was not deformed while maintaining natural gloss of the porous polydimethylsiloxane film (FIG. 9).

While example embodiments have been shown and described above, it will be apparent to those skilled in the art that modifications and variations could be made without departing from the scope of the present disclosure as defined by the appended claims.

The invention claimed is:
1. A solar cell module comprising:
   a rear protective layer;
   an encapsulant;
   a solar cell; and
   a porous polysiloxane film for antireflection,

TABLE 1

| | Transmittance (%) | Pore No. per Unit Area (pcs/cm²) | Pore Average Particle Diameter (μm) | Short Circuit Current Density ($J_{SC}$) (mA/cm²) | Open Circuit Voltage ($V_{OC}$) (V) | Filling Rate (F.F.) (%) | Conversion Efficiency (%) | $\eta/\eta_0$ (%) |
|---|---|---|---|---|---|---|---|---|
| IE1 | 99 | 3.6 × 10⁶ | 10 | 13.25 | 1.657 | 0.724 | 15.90 | 105.02 |
| IE2 | 95 | 3.6 × 10⁶ | 10 | 12.74 | 1.657 | 0.717 | 15.15 | 100.07 |
| IE3 | 96 | 3.6 × 10⁶ | 10 | 13.15 | 1.659 | 0.726 | 15.84 | 104.62 |
| CE1 | 99 | 0 | — | 13.08 | 1.648 | 0.702 | 15.14 | — |
| CE2 | 94 | 0 | — | 12.72 | 1.648 | 0.717 | 15.02 | 99.2 |
| CE3 | 93 | 0 | — | 13.07 | 1.648 | 0.687 | 14.80 | 97.8 |

IE: Inventive Example, CE: Comparative Example

In Table 1, it can be seen that the solar cell modules of Inventive Examples 1 to 3 have improved short circuit current density, open circuit voltage, filling rate, and conversion efficiency, as compared to the solar cell modules of Comparative Examples 1 to 3. This may be because reflectance in a surface portion of the porous PDMS film was lowered by pores present in the surface portion, which increases an amount of light transmitted to the solar cell.

In Inventive Example 2 to which the dye having a sky blue color was added, conversion efficiency of the solar cell was reduced by about 0.75%, as compared to Inventive Example 1 to which the dye was not added. In silicon solar cells, photoelectron conversion occurred mainly in the wherein the porous polysiloxane film is manufactured by a method comprising
   disposing and sealing a mixed solution including liquid polydimethylsiloxane and a curing agent in a humidified environment;
   curing the mixed solution to form a polysiloxane film; and
   evaporating water droplets formed on a surface of the polysiloxane film,
wherein the porous polysiloxane film has 3.5×10⁶ to 1.0×10⁷ pores per unit area (cm²) in a surface portion, and an average diameter of the pores is 10 to 15 μm,
wherein the mixed solution further comprises 15 to 200 nL of a dye for 1 g of liquid polydimethylsiloxane, and wherein the porous polysiloxane film has a color.

2. The solar cell module of claim 1, wherein the mixed solution is a mixture of the liquid polydimethylsiloxane and the curing agent in a weight ratio of 1:1 to 1:2.

3. The solar cell module of claim 1, further comprising vacuum degassing to remove air bubbles from the mixed solution.

4. The solar cell module of claim 1, wherein the porous polysiloxane film has a transmittance of 95 to 99%.

5. The solar cell module of claim 1, wherein the porous polysiloxane film has a haze value of 20 to 50%.

* * * * *